United States Patent [19]

Wank et al.

[11] Patent Number: 4,810,321
[45] Date of Patent: Mar. 7, 1989

[54] PROCESS FOR THE PREPARATION OF A METAL-PLASTIC LAMINATE

[75] Inventors: Joachim Wank, Dormagen; Claus Burkhardt, Krefeld; Hans-Wolfgang Schmoranzer, Willich, all of Fed. Rep. of Germany

[73] Assignee: Bayer Akteingesellschaft, Leverkusen, Fed. Rep. of Germany

[21] Appl. No.: 53,871

[22] Filed: May 26, 1987

[30] Foreign Application Priority Data

Jun. 6, 1986 [DE] Fed. Rep. of Germany ....... 3619032

[51] Int. Cl.$^4$ ............................................. B32B 31/00
[52] U.S. Cl. .............................. 156/244.23; 156/331.7
[58] Field of Search ............ 156/244.23, 331.7, 244.11

[56] References Cited

U.S. PATENT DOCUMENTS 3,981,762  9/1976  Davis et al. ...................... 156/331.7

FOREIGN PATENT DOCUMENTS 7309479  3/1973  Japan ............................... 156/244.23
8033632  9/1978  Japan ............................... 156/331.7
 250938 12/1985  Japan ............................... 156/244.23
 600163  3/1978  U.S.S.R. ........................... 156/331.7

Primary Examiner—Caleb Weston
Attorney, Agent, or Firm—Connolly & Hutz

[57] ABSTRACT

Metal-plastic laminates are prepared by coating a metal component with a polyurethane adhesion promoter in dissolved or dispersed form, drying the liquid phase and coating with the melt of a thermoplastic by the extrusion coating process.

10 Claims, No Drawings

PROCESS FOR THE PREPARATION OF A METAL-PLASTIC LAMINATE

The invention relates to a process for the preparation of a metal-plastic laminate using polyurethane adhesive layers.

Metal-plastic laminates are currently prepared by spraying or coating the metal components with an appropriate plastic material.

To improve the adhesion between the metal and plastic article, the metal components are embossed, perforated, shaped in a meandering fashion and the like in the region of the covering of plastic. Although a high resistance to mechanical tensile strain can be achieved by this type of mechanical change, a bond which is moisture-tight or pressure-resistant is not thereby achieved, since the different coefficients of expansion of the metal and plastic give rise to hair-cracks during the cooling process. For applications where the requirement of resistance to vapour and pressure is absolutely essential, numerous experiments have been carried out in order to achieve this goal. With the solutions obtained so far, resin systems which had surface adhesion both to the metal and to the plastic were applied to the inside and outside of the housings in the region of the metal contacts after the metal components had been covered or coated.

Since these systems are usually very thin layers, they had the disadvantage that mechanical stress gave them hair cracks and they therefore no longer fulfilled their task.

There has therefore been no lack of attempts to achieve a bond between the plastic and metal in the region of the covering which meets the requirement in respect of resistance to vapour and pressure. The previously known possibility of achieving this aim in a few metal-plastic combinations comprises using epoxy resins as adhesion promoters between the metal and plastic. This is limited to only a few plastics because epoxy resins only undergo bonding with a few plastic materials, are very brittle and moreover are difficult to process, since the system is a 2-component system.

Although laminated films with polyurethane adhesion promoters are known from German Patent Specification No. A-2,517,032, no metal-plastic adhesion is described here.

The known processes for the preparation of a metal-plastic laminate are expensive and unsatisfactory.

The invention was therefore based on the object of preparing metal-plastic laminate systems in a simple manner.

The invention relates to a process for the preparation of a metal-plastic laminate, which is characterized in that a metal component is coated with a polyurethane in dissolved or dispersed form, the liquid phase is stripped off and the PU-coated component thus obtained is coated with the melt of a thermoplastic by the extrusion coating process.

In a particularly preferred embodiment, the metal component is a foil which is, in particular, 0.01 to 0.5 mm thick. The PU layer, when dry, has film thicknesses of 1 to 80 $\mu$m, preferably 10 to 30 $\mu$m.

According to the invention, the metal component of the resulting metal-plastic laminate can be partially etched away by customary procedures and in accordance with prescribed patterns to give an electrical circuit and, if appropriate, subsequently shaped three-dimensionally. The component thus obtained can be injected from behind with another thermoplastic on the free surface of the plastic.

The metal components to be used according to the invention are preferably prepared in the form of metal foils. These are preferably prepared by cold- and hot-rolling of appropriate metal sheets or, especially in the case of copper foils, by continuous electrolytic deposition of copper-II solutions onto a corrosion-resistant continuous steel belt which is connected as the cathode and is immersed in the bath of copper-II solution and moves continuously in this bath in one direction. The thin layer of copper formed on the steel belt by electrolytic deposition is stripped off at a turning point in the steel belt.

To prepare the polyurethane layers which are suitable according to the invention, it is possible to use either aqueous dispersions, which dry to transparent films, of preferably linear polyester-polyurethanes having COOH and/or sulphonic acid groups, or organic solutions, which dry to transparent films, of preferably linear polyester-polyurethanes, which optionally contain a polyisocyanate of higher functionality as a crosslinking agent. Examples of suitable polyurethane dispersions are those which are based on linear polyesterdiols, aromatic or aliphatic diisocyanates and, if appropriate, the customary chain-lengthening agents and have been prepared by also using ionic builder components in accordance with U.S. Pat. No. A-3,479,310 or German Patent Specification No. A-1,495,847. Aqueous dispersions of preferably linear polyester-polyurethanes which contain carboxylate and sulphonate groups, such as can be obtained according to German Patent Specification No. A-2,804,609, are also particularly suitable. If organic solutions of preferably linear polyester-polyurethanes are used, solutions of nonionic linear polyester-polyurethanes in suitable solvents are preferably suitable. These polyurethanes are preferably reaction products of (i) diisocyanates, such as 2,4and/or 2,6-diisocyanatotoluene, 4,4'-diisocyanatodiphenylmethane, hexamethylene diisocyanate, isophorone diisocyanate or 1,5-diisocyanatonaphthalene or mixtures thereof with (ii) polyesterdiols in the molecular weight range ($\overline{M}w$) from 1,000 to 5,000, preferably from 1,500 to 4,000, in particular those based on adipic acid and/or phthalic acid, and suitable alkylenediols, such as ethylene glycol, 1,4-butanediol, 1,6-hexanediol and/or mixtures thereof, and if appropriate (iii) chain-lengthening agents, for example the diols last mentioned, the reaction partners being used such that an NCO/OH equivalent ratio of 0.9:1 to 1:1.1, preferably 0.95:1 to 1:1, is maintained, if appropriate 0.1 to 0.2 mol of chain-lengthener or chain-lengthener mixture being used per mol of polyester-diol. Examples of suitable solvents for such polyester-polyurethanes are ethyl acetate, butyl acetate, methyl ethyl ketone, methyl isobutyl ketone or mixtures consisting of such solvents. The dispersions or solutions are in general used with a solids content of 10–40% by weight. It may frequently be advantageous to incorporate minor amounts of a polyisocyanate of higher functionality, for example tris-(6-isocyanatohexyl)-biuret, into the solutions mentioned in order to improve the mechanical properties of the polyurethane film finally obtained.

Polyurethane systems which are likewise suitable are reaction products of polyethers with diisocyanates, a preferred polyether being polypropylene oxide, and these polyethers being reacted with the abovementioned diisocyanates in a known manner, the reaction being carried out such that either polyurethanes with a free NCO content of 0.5 to 10% by weight, preferably 0.5 to 5% by weight, or polyurethanes with a free OH content of 0.5 to 15% by weight, preferably 0.5 to 5% by weight, are obtained.

The polyurethane adhesives described can be hardened in order to increase the resistance to heat.

For this, the polyurethane adhesives mentioned on page 2 are reacted with diols or amine-containing epoxy resins and the polyurethane adhesives mentioned on page 3 are reacted with isocyanates, preferably triisocyanates, in a known manner. Examples of suitable triisocyanates are those obtainable by reaction of 1 mol of trimethylolpropane with 3 mol of the isomer mixture of 2,4- and 2,6diisocyanatotoluene, or biuret polyisocyanates of hexamethylenediisocyanate.

Particularly suitable polyurethanes are a polyurethane dispersion system based on a linear polyesterurethane, preferably based on polyalkylene adipate or polyalkylene phthalate, having a molecular weight from 1,000 to 8,000, preferably of about 2,000, and a diisocyanate, preferably toluylene diisocyanate or hexamethylene diisocyanate and chain lengthening with diamines containing sulphonic acid or carboxylic acid, where appropriate as a mixture with aliphatic diamines. Further polyurethane components are polyurethane solutions based on polyalkyleneadipates, preferably polybutylene adipate or mixed polybutylene/polyhexamethylene adipate, having a molecular weight from 1,000 to 8,000 and hexamethylene diisocyanate, where appropriate as a mixture with isophorone diisocyanate in a ratio of 1 to 99 : 99 to 1, and where appropriate diol chain lengtheners and/or isophoronediamine. Further preferred polyurethanes are polyester-urethane solutions preferably containing OH terminal groups to which triisocyanates are added. Other preferred polyurethane solutions are those in which polyether-urethane solutions having terminal NCO groups are used which have been reacted with amine-containing chain lengtheners.

The PU layer can be applied continuously to the metal foil either by the roll-coater or knife-blade process, by the curtain coating process or by the airless spraying process. The amount of dispersion or solution is in general such that dry film thicknesses of 1–80 μm, preferably 10–30 μm, result.

Plastics to be used according to the invention are, in particular, thermoplastics, especially are those of known thermoplastic aromatic polycarbonates with weightaverage molecular weights $\overline{M}w$ of 25,000 to 200,000, preferably 30,000 to 120,000 and in particular 30,000 to 80,000 ($\overline{M}w$ determined via the $\eta_{rel}$ in CH$_2$Cl$_2$ at 20° C. and a concentration of 0.5 g per 100 ml); thermoplastics which are suitable according to the invention are also preferably those of known thermoplastic polyaryl sulphones, which can be linear (see DE-OS (German Published Specification No. ) 2,735,144) or branched (see DE-OS (German Published Specification), No. 2,735,092 and DE-OS (German Published Specification) No. 2,305,513).

Suitable linear polyaryl sulphones are all the known aromatic polysulphones or polyether-sulphones with an $\overline{M}w$ (weight-average molecular weight measured, for example, by means of light scattering) of between about 15,000 and about 55,000, preferably between about 20,000 and about 40,000. Such polyaryl sulphones are described, for example, in German Patent Specification No. A-1,719,244 and U.S. Pat. No. A-3,365,517.

Suitable branched polyaryl sulphones are, in particular, the branched polyaryl ether-sulphones according to German Patent Specification No. A-2,305,413 and U.S. Pat. No. A-3,960,815, the $\overline{M}w$ (weight-average molecular weight, measured, for example, by means of light scattering) of which is between about 15,000 and about 50,000, preferably between about 20,000 and 40,000.

Preferred suitable thermoplastics are also thermoplastic cellulose esters, thermoplastic polyvinyl chlorides, thermoplastic styrene/acrylonitrile copolymers, polyolefines, polyamides, polyalkylene and polyarylene terephthalates, polyphosphonates and polyphenyl sulphide. Cellulose esters which are suitable according to the invention are obtained by customary processes by esterification of cellulose with aliphatic monocarboxylic acid anhydrides, preferably acetic and butyric anhydride or acetic and propionic anhydride. The hydrolysis to be carried out in the crude solution is controlled by a slight excess of water such that a low hydroxyl content (4 to 25) is obtained. The oxidative bleaching of the cellulose ester isolated from the solution must be carried out such that oxidizing agent is no longer detectable in the end product; if appropriate, after-treatment with reducing agents must be carried out. To determine the OH number, the free hydroxyl groups of the cellulose ester are esterified with acetic anhydride in pyridine, the excess anhydride is reacted with water and a back-titration is carried out (instructions: C. J. Mahn, L. B. Genung and R. F. Williams, Analysis of Cellulose Derivatives, Industrial and Engineering Chemistry, Vol. 14, No. 12, 935–940 (1942)).

The viscosity of the cellulose esters should be 0.3 to 0.5 poise, measured as a 20% strength by weight solution in acetone. Cellulose esters which are preferably to be used have, in the case of the acetobutyrates, an acetic acid content of 17 to 23% by weight and a butyric acid content of 45 to 50% by weight, and, in the case of the acetopropionates, a propionic acid content of 61 to 69% by weight and an acetic acid content of 2 to 7% by weight. The OH numbers are usually between 4 and 25. The mean weight-averages of the molecular weights $\overline{M}w$ are between 10,000 and 1,000,000, preferably between 100,000 and 500,000.

Examples of thermoplastic polyvinyl chlorides which are suitable according to the invention are the commercially available grades of PVC.

Thermoplastic styrene-acrylonitrile copolymers which are suitable according to the invention are copolymers of styrene and, preferably, acrylonitrile which are obtained from the monomers or mixture of monomers with an $\overline{M}w$ of 10,000 to 600,000 ($\overline{M}w$ measured in dimethylformamide at C=5 g/l and 20° C.), for example, by suspension polymerization in the presence of catalysts. For literature in this context, see Beilsteins Handbuch der Organischen Chemie (Beilstein's Handbook of Organic Chemistry), 4th edition, supplement 3, Volume 1.5, pages 1163–1169, Springer Verlag 1964, and H. Ohlinger, Polystyrol 1. Teil, Herstellungsverfahren und Eigenschaften der Produkte (Polystyrene, Part 1, Preparation processes and properties of the products), Springer Verlag (1955).

The plastic is applied to the metal component coated with the polyurethane, in particular the metal foil, in a known manner by the extrusion coating process.

In this, a metal foil coated with the polyurethane runs into the roll nip of a laminating station such that it comes into contact with the melt of the thermoplastic, which comes out of a nozzle aligned vertical to the roll nip.

At the moment at which the melt of plastic comes into contact with the polyurethane layer, an intimate bond strength develops between the components.

The thickness of the thermoplastic layer depends on the ratio of the take-off speed of the laminate of the components and the amount of thermoplastic melt pressed on per uit time.

This laminate can be shaped by deep-drawing to give three-dimensional structures such as can be used, for example, as a shielding covering for electromagnetic waves in electrical and electronic equipment.

The printed circuits produced from this laminate, which are prepared in a known manner by partial etching away of the metal foil, are of great importance.

The circuits thus produced can likewise be shaped three-dimensionally, no delamination of the components occurring due to the extremely high bond strength.

The laminate can moreover be injected from behind with a further thermoplastic by the injection-moulding process. For this purpose, the two- or three-dimensionally shaped laminate is placed in an injection mould and the other thermoplastic is injected onto part or all of the free surface of the thermoplastic film.

The second thermoplastic layer is preferably of thermoplastic polymethyl methacrylate, thermoplastic acrylonitrile/butadiene/styrene copolymers, thermoplastic polystyrene, thermoplastic polycarbonate, thermoplastic styrene/acrylonitrile copolymers, thermoplastic cellulose esters, thermoplastic polyaryl sulphone, polyvinyl chloride, polyamide, thermoplastic aliphatic polyesters, aromatic polyesters, thermoplastic polycarbonate, thermoplastic polyphenylene sulphide, thermoplastic polyphenylene oxide, thermoplastic polyether-ester-ketone or other thermoplastic polymers or copolymers which have been disclosed, but they can also be identical to the plastic laminated over the PU layer.

Examples of thermoplastic polymethyl methacrylates are the commercially available grades of Plexiglas.

Thermoplastic acrylonitrile/butadiene/styrene copolymers are, in particular, mixtures of a) 50 to 70% by weight of one or more grafted products and b) 95 to 30% by weight of one or more thermoplastic resins.

Grafted products (a) are preferably polymers which are obtained by polymerization of grafting monomers in the presence of a rubber as the graft base. The rubber content is preferably 5 to 80% by weight, but also depends on the polymerization process.

Possible graft bases are, in particular, polybutadiene, natural rubber, a butadiene/acrylonitrile copolymer and a butadiene/styrene co- or block polymer. Acrylic ester/vinyl ether polymers and EPDM terpolymers can also be used. Grafting monomers are chiefly styrene mixtures of styrene and acrylonitrile, preferably in a weight ratio of 90:10 and 50:50, mixtures of styrene and methyl(meth)acrylate, preferably in a weight ratio of 5:95 to 95:5, and styrene/acrylonitrile/methyl(meth)acrylate mixtures.

The preparation of such grafted products is known per se. The grafting monomers can be polymerized in emulsion in the presence of a rubber latex. The grafting reaction is then started with a free radical initiator. If the rubber is not crosslinked and certain proportions of grafting monomers and graft bases are maintained during the grafting reaction, the size of the rubber particles in the latex determines the particle size of the resulting grafted polymer. The grafted shell of chains of the polymer of the grafting monomers bonded chemically to the rubber particles is relatively thin and does not substantially change the size of the rubber particle. Size here is understood as the $d_{50}$ value, that is to say the diameter above which and below which in each case 50% of the diameters of the particles lie. The grafting reaction is incomplete, so that its product is called a grafted product. In addition to the actual grafted polymer, it also contains non-grafted copolymers of the grafting monomers.

The grafted polymers can also be prepared by bulk-/solution or bulk/suspension polymerization, preferably from monomer-soluble rubber. The size of the grafted rubber particles is then determined in the phase inversion stage and can be influenced mechanically (by stirring) and by chemical influencing of the phase equilibrium (addition of dispersing agents). Particles of 1 $\mu$m diameter or larger are in general obtained in bulk/solution grafting processes. The rubber content of the grafted product is limited to not more than 25% by weight.

Products with particles 0.05 to 20 $\mu$m in size and those in which a considerable proportion of the grafting monomers are included inside the rubber particles as a homo- or copolymer can be used according to the invention. Preferred particle sizes are 0.05 to 1.2 $\mu$m, in particular 0.05 to 0.6 $\mu$m. It is also possible for several different grafted products to be employed side by side, for example two grafted products which differ by the degree of grafting (or by the grafting density), the particle size or both at the same time. A mixture of a grafted product with particles with a size $d_{50}$ of 0.35 and 10 $\mu$m and a grafted product with particles of a size $d_{50}$ of 0.05 to 0.32 $\mu$m (ABS polymers prepared in this way are also called bimodal systems) for example, is particularly suitable.

The grafted products preferably contain 35 to 80% by weight, in particular 40 to 70% by weight, of rubber and have particle sizes $d_{50}$ of 0.1 to 0.5 $\mu$m. They are employe in an amount such that the finished ABS polymer contains 5 to 25% by weight, preferably 5 to 20% by weight, of rubber.

The thermoplastic resin (b) which forms the second constituent of the ABS polymer is the continuous matrix and is a polymer or copolymer of styrene, $\alpha$-methylstyrene/acrylonitrile/methyl(meth)acrylate or maleic anhydride. Polystyrene, styrene/acrylonitrile copolymers with an acrylonitrile content of 20 to 35% by weight and methylstyrene/acrylonitrile copolymers with an acrylonitrile content of 20 to 31% by weight are preferred. The weight-average of the molecular weight ($\overline{M}w$) of these resins is 50,000 to 550,000; the molecular heterogeneity H·($\overline{MW}/\overline{M}/N - 1 =$ H) is 1.0-3.5 ($\overline{M}n =$ number average of the molecular weight)

If a single grafted product is used, it is advantageous for the quantitative composition of the grafting monomers and that of the resin to be similar or identical. If a mixture of two grafted products of different particle sizes is used, it is advantageous for the quantitative composition of the grafting monomers of the grafted product with the coarser particles to be different from the composition of the resin.

The thermoplastic resins, for example styrene/acrylonitrile or $\alpha$-methylstyrene/acrylonitrile copolymers, can be prepared by known processes, for example by bulk polymerization, solution polymerization, suspension polymerization and emulsion polymerization.

The grafted product and thermoplastic resin are frequently prepared separately, both usually by emulsion polymerization. If the components are obtained in latex form, the latices can be mixed and precipitated together.

Thermoplastic polystyrenes which are suitable for preparation of the layer of plastic are homopolymers of styrene or copolymers of styrene with, preferably, acrylonitrile and/or butadiene, and/or maleic acid esters, which are obtained from the monomers or the mixture of monomers with $\overline{M}w$ 10,000 to 600,000 ($\overline{M}w$ is measured in dimethylformamide at c=5 g/l and 20° C.), for example by suspension polymerization in the presence of catalysts. (For literature in this context, see: Beilsteins Handbuch der Organischen Chemie (Beilstein's Handbook of Organic Chemistry), 4th edition, supplement 3, Volume 5, pages 1163–1169, Springer Verlag 1964, H. Ohlinger, Polystyrol, 1. Teil, Herstellungsverfahren und Eigenschaften der Produkte (Polystyrene, Part 1, Preparation processes and properties of the products), Springer Verlag 1955).

The further layer of plastic is introduced by injection from behind by known processes, and in this context see, for example, German Patent Specification No. A-2,755,088. The thickness of the further layer of plastic is preferably between 1 and 20 mm.

The advantages of the PU adhesive layers used according to the invention are their tack-free behaviour at room temperature at the surface of the coating, and nevertheless outstanding adhesion to metal, furthermore formation of an adhesive layer with excellent adhesion and a flexible levelling effect during hot-melt lamination to the thermoplastics without embrittlement, so that even on cooling of the molten layer no tearing or partial peeling as a result of shearing forces occurs.

The polyurethanes furthermore have a good adhesion to very many thermoplastics (not just to a few selective substances, such as adhesive layers according to the prior art).

EXAMPLE 1

A hard copper foil 35 μm thick is precoated on one side with a 30% strength polyurethane dispersion based on a polyester of aromatic dicarboxylic acid and alkylenediols, hexamethyl diisocyanate and a diaminosulphonic acid (Dispercol ® 8100 from Bayer AG, D-5090 Leverkusen), by the roll coater process and after drying at 75° to 85° C., to give a 10 μm thick layer of the polyurethane system mentioned. This precoated Cu foil is allowed to run into the roll nip of an extrusion coating line and is coated with the melt of a polycarbonate based on bisphenol A, the relative viscosity $\eta_{rel}$ of which is 1.32 (measured at 0.5% strength in methylene chloride at 23° C.). The coating thickness of the polycarbonate layer applied is 100 μm.

A flexible printed circuit is prepared from this laminate by partial etching away of the copper foil by methods which are customary per se.

The resulting flexible circuit is placed in an injection mould and injected from behind on the polycarbonate side with the melt of an ABS thermoplastic based on polyacrylonitrile/butadiene/styrene with a relative viscosity of 1.4 (measured at 1% strength in acetone).

EXAMPLE 2

Preparation of a laminate according to Example 1 but using a melt of a polyphenylene sulphide. A flexible circuit is produced from the resulting laminate by partial etching away of the copper layer. This flexible circuit is shaped three-dimensionally according to the shape of the housing of an electronic unit. The unit is then fitted with electronic components by the SMD process. The fitted three-dimensionally-printed circuit is inserted into the housing provided and fixed at the corner points by contact adhesive.

EXAMPLE 3

A hard copper foil 35 μm thick is coated on one side with an approx. 30% strength solution of a polyurethane containing terminal OH groups and based on an adipic acid/butane-1,4-diol/hexane-1,6-diol copolyester and hexamethylene diisocyanate (Desmocol ® 8303 from Bayer AG, D-5090 Leverkusen), dissolved in a 1:1 mixture of ethyl acetate/methyl ethyl ketone, to which was added, for crosslinking, the biuretriisocyanate of the hexamethylene diisocyanate (Desmodur ® from Bayer AG) in amounts of 0, 0.5 and 1 and 3% by weight, relative to PU solids, by the roll coater process, and is dried at 80° C. The PU layer is 18 μm thick.

This PU-coated Cu foil is in each case coated on one side, as described in Example 1, with a melt of polyphenylenesulphide (PPS) in a layer thickness of 75 μm. A flexible printed circuit is produced from this laminate by partial etching away of the Cu foil in accordance with prescribed circuit patterns by a customary procedure. The flexible circuit obtained is inserted in an injection mould and injected from behind on the PPS foil side with the melt of PPS at a melt temperature of about 360° C. in the PPS. This laminate part can be fitted with electrical components and contacted by a soldering bath by the continuous method. Such laminates and circuit components are very stable mechanically and also on exposure to vapours and produce circuit components possessing an excellent safeguard against contact failure.

We claim:

1. A process for the preparation of a metal-plastic laminate comprising, first coating a metal component with a coating consisting essentially of a polyurethane, by applying the polyurethane, which is dissolved or dispersed in a liquid and then stripping the liquid, and second, coating the thus formed coated component with a melt of a thermoplastic polymer, by an extrusion coating process, wherein the thermoplastic polymer is selected from a cellulose ester, a polyvinyl chloride, a polyamide, a polycarbonatge, a polysulphone, an acrylonitrile-butadiene-styrene copolymer, a polymethyl methacrylate, a polyphenylene suphide, a polyalkylene terephthalate, a polyarylene terephthalate, a polyphenylene oxide, a polyphosphonate or a polyether-ester ketone.

2. A process according to claim 1, wherein the metal component is a metal foil.

3. A process according to claim 2, wherein the metal foil has a layer thickness of 0.01 to 0.5 mm and the polyurethane coating has a dry film thickness of 1 to 80 μm.

4. A process according to claim 3, wherein the polyurethane coating has a dry film thickness of 10 to 30 μm.

5. A process according to claim 1 wherein the polyurethane is dispersed in a liquid and wherein the polyurethane is formed from a linear polyester-urethane, a diisocyanate and a diamine containing carboxylic acid or sulphonic acid.

6. A process according to claim 1 wherein the polyurethane is dissolved in a liquid and wherein the polyurethane is formed from a polyester adipate and hexamethylene diisocyanate.

7. A process according to claim 1 wherein the polyurethane is dissolved in a liquid and where the polyurethane is cross-linked with triisocyanates or polyisocyanates.

8. A process according to claim 1 wherein the polyurethane is dissolved in a liquid and where the polyurethane is a polyether-urethane having NCO groups which have been reacted with amine-containing chain lengtheners.

9. A process according to claim 1 further comprising, the metal component of the thus formed metal-plastic laminate is partially etched away to produce an electrical circuit and the electrical circuit is shaped three dimensionally.

10. A process according to claim 1 further comprising the metal component of the thus formed metal-plastic laminate is partially etched away to produce an electrical circuit and the electrical circuit is shaped three dimensionally, the electrical circuit is then injected from behind with a thermoplastic polymer selected from a cellulose ester, a polyvinyl chloride, a polyamide, a polycarbonate, a polysulphone, an acrylonitrile-butadiene-styrene copolymer, a polymethyl methacrylate, a polyphenylene sulphide, a polyalkylene terephthalate, a polyarylene terephthalate, a polyphenylene oxide, a polyphosphonate or a polyetherester ketone.

* * * * *